(12) United States Patent
Wang et al.

(10) Patent No.: US 9,000,831 B2
(45) Date of Patent: Apr. 7, 2015

(54) PASS GATE CIRCUIT

(71) Applicant: STMicroelectronics R&D (Shanghai) Co. Ltd., Shanghai (CN)

(72) Inventors: Fei Wang, Shanghai (CN); KunKun Zheng, Shanghai (CN)

(73) Assignee: STMicroelectronics R&D (Shanghai) Co. Ltd, Shanghai (CN)

( * ) Notice: Subject to any disclaimer, the term of this patent is extended or adjusted under 35 U.S.C. 154(b) by 0 days.

(21) Appl. No.: 14/073,924

(22) Filed: Nov. 7, 2013

(65) Prior Publication Data

US 2014/0184305 A1    Jul. 3, 2014

(30) Foreign Application Priority Data

Dec. 31, 2012  (CN) .................... CN 2012 1 0596220

(51) Int. Cl.
*H03K 17/687* (2006.01)
*H03K 17/10* (2006.01)

(52) U.S. Cl.
CPC .................... *H03K 17/102* (2013.01)

(58) Field of Classification Search
USPC .................................. 327/427, 434; 333/103
See application file for complete search history.

(56) References Cited

U.S. PATENT DOCUMENTS

| 5,754,074 | A | * | 5/1998 | Kelly | 327/434 |
| 5,886,570 | A | * | 3/1999 | Brokaw | 327/540 |
| 6,208,194 | B1 | * | 3/2001 | Kennedy | 327/427 |
| 6,717,785 | B2 | * | 4/2004 | Fukuda et al. | 361/93.1 |
| 6,891,707 | B2 | * | 5/2005 | Hiyama et al. | 361/93.1 |

* cited by examiner

*Primary Examiner* — Kenneth B. Wells
(74) *Attorney, Agent, or Firm* — Gardere Wynee Sewell LLP

(57) ABSTRACT

A pass gate circuit includes a first transistor coupled between an input node (receiving an input signal) and an output node (outputting an output signal). A second transistor is configured to generate a voltage difference in response to a bias current flowing therethrough, wherein that voltage difference is applied between a first gate of the first transistor and the output node. A differential amplifier functions to compare the voltage at the output node to a reference voltage and generate the bias current in response to that comparison.

19 Claims, 3 Drawing Sheets

PASS GATE CIRCUIT

PRIORITY CLAIM

This application claims priority from Chinese Application for Patent No. 201210596220.6 filed Dec. 31, 2012, the disclosure of which is incorporated by reference.

TECHNICAL FIELD

This invention relates generally to electronic circuits, and more particularly to a pass gate circuit.

BACKGROUND

In many high voltage circuit applications, before providing an input signal to an internal circuit component consisting of low voltage transistors, a pass gate circuit component is cascaded in an input stage of the circuits to limit the amplitude of the input signal. The pass gate circuit component can protect the low voltage transistors in the internal circuit from breakdown due to an accidental high voltage, which improves the stability of the high voltage circuits.

FIG. 1 shows a conventional pass gate circuit 10. As shown in FIG. 1, the pass gate circuit 10 comprises a DMOS transistor 11 coupled between an input node 12 and an intermediate node 13 of an internal Schmitt trigger 14. A gate of the DMOS transistor 11 is coupled to receive a supply voltage $V_{sup}$. However, when passing an input signal $V_{in}$, received at the input node 12 to the intermediate node 13, an intermediate voltage $V_{im}$ at the intermediate node 13 may experience a threshold voltage loss, because the DMOS transistor 11 is turned on only when its gate-to-source voltage is higher than its threshold voltage $V_{th}$. Therefore, the maximum amplitude of the intermediate voltage $V_{im}$ equals to the supply voltage $V_{sup}$ minus the threshold voltage $V_{th}$. As the threshold voltage $V_{th}$ for the DMOS transistor 11 is generally higher than 1 volt, the range of the intermediate voltage $V_{im}$ provided by the pass gate circuit 10 is significantly decreased.

FIG. 2 shows another conventional pass gate circuit 20. As shown in FIG. 2, the pass gate circuit 20 comprises a DMOS transistor 21 and a resistive divider with a first resistor 22 and a second resistor 23. The first resistor 22 is coupled between an input node 24 and a drain of the DMOS transistor 21, and the second resistor 23 is coupled between a source of the DMOS transistor 21 and the ground. An intermediate voltage $V_{im}$ is provided to an internal Schmitt trigger 25 at the source of the DMOS transistor 21. However, the resistive divider may introduce additional sensing error into the circuit 20 due to the first resistor 22. In some cases, a pull up current cannot be applied to the pass gate circuit 20 as the second resistor 23 introduces a pull-down current path from the source of the DMOS transistor 21 to the ground.

SUMMARY

Thus, there is a need for a pass gate circuit with a wider pass voltage range.

In one aspect, a pass gate circuit comprises: a first transistor coupled between an input node for receiving an input signal and an output node for outputting an output signal; a second transistor, configured to generate a voltage difference between a second gate and a second source thereof in response to a bias current flowing therethrough, and to apply the voltage difference between a first gate of the first transistor and the output node; and an amplifier, configured to compare the output signal with a reference voltage, and to supply the bias current to the second transistor according to the comparison.

In some embodiments, the voltage at the first gate of the first transistor can be elevated with the output signal via the second transistor, and thus the output signal outputted by the first transistor will not experience a threshold voltage loss in comparison with the input signal. In this way, the pass gate circuit can have a wider pass voltage range. Besides, the amplifier can be used to clamp the output signal lower than the reference voltage. Furthermore, the pass gate circuit will not introduce any sensing error because there is no current path through the input node.

In an embodiment, the amplifier comprises: a differential input stage, configured to receive the output signal and the reference voltage, and to output a first current at a first output node and a second current at a second output node according to the output signal and the reference voltage; and a first current mirror, configured to mirror the second current to the first output node to generate the bias current according to the difference current of the first current and the second current.

In an embodiment, the differential input stage comprises: a third transistor and a fourth transistor coupled in parallel with the third transistor, wherein a third source of the third transistor and a fourth source of the fourth transistor are coupled together to receive a reference current, a third gate of the third transistor is coupled to the output node to receive the output signal, a fourth gate of the fourth transistor is coupled to the reference voltage, a third drain of the third transistor is coupled to a first branch of the first current mirror, and a fourth drain of the fourth transistor is coupled to a second branch of the first current mirror.

In an embodiment, the first current mirror has a first branch and a second branch, the first branch being coupled between a second reference potential line and the first output node, and the second branch being coupled between the second reference potential line and the second output node.

In an embodiment, the pass gate circuit further comprises a current source, coupled to the amplifier, configured to provide a reference current to supply the amplifier.

In an embodiment, the first transistor is an NMOS transistor, and the second transistor is a PMOS transistor, the second source is coupled to the amplifier, the second gate is coupled to the output node, and a second drain of the second transistor is coupled to a first reference potential line.

In an embodiment, the pass gate circuit further comprises one or more transistors coupled in series with the second transistor, wherein each of the one or more transistors has a drain and a gate coupled together respectively.

In an embodiment, the first transistor is a DMOS transistor. The DMOS transistor comprises a drift region coupled to the drain thereof, which allows the DMOS transistor to withstand the input signal of a significantly high voltage.

In an embodiment, the pass gate circuit further comprises: a pull up circuit, configured to provide a pull up current to the output node. The pull up circuit can set the voltage of the output node to a fixed voltage level when the input node is floating.

In an embodiment, the pull up circuit comprises a second current mirror having a third branch and a fourth branch, the third branch being configured to receive a reference current, and the fourth branch being coupled to the output node to provide the pull up current in response to the reference current.

The foregoing has outlined, rather broadly, features of the present invention. Additional features of the invention will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF THE DRAWINGS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

Figure 1:
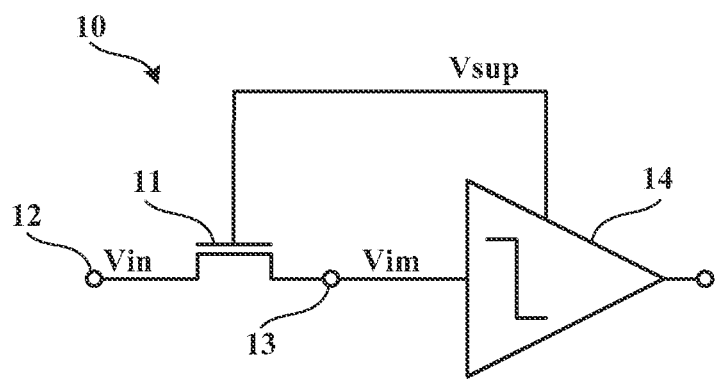
FIG. 1 shows a conventional pass gate circuit.
Figure 2:
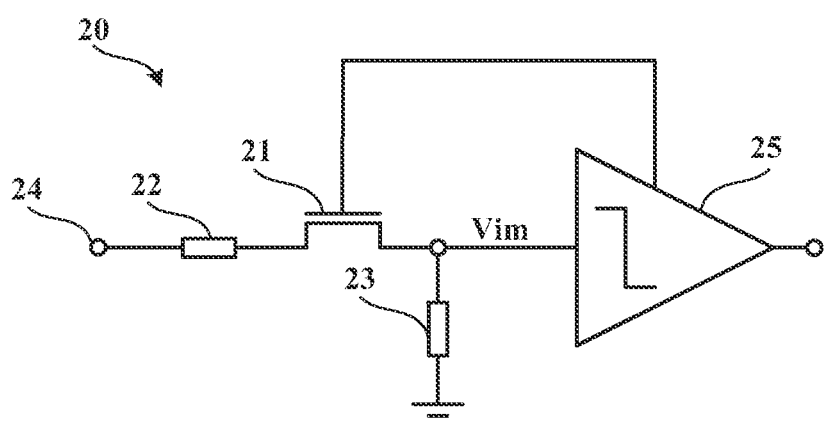
FIG. 2 shows another conventional pass gate circuit.
Figure 3:
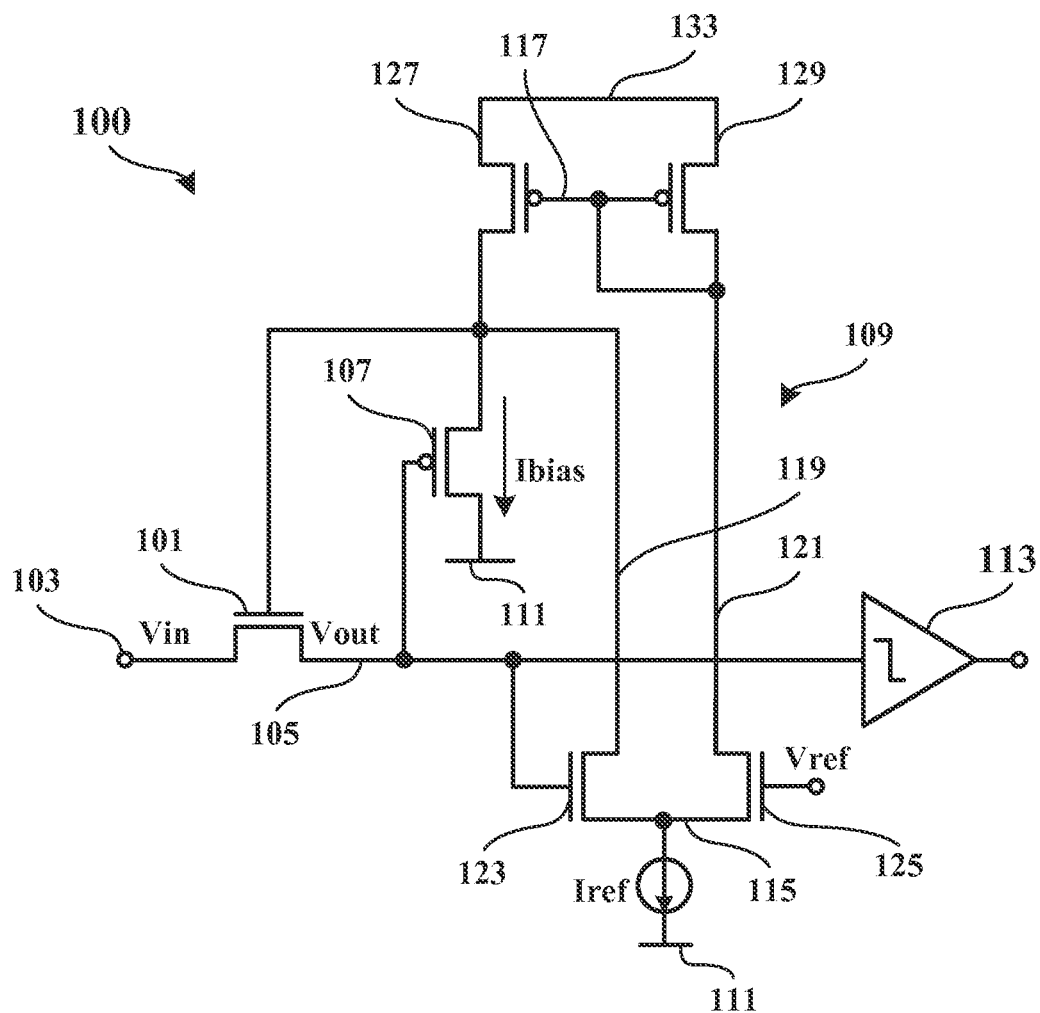
FIG. 3 shows a pass gate circuit according to a first embodiment.

FIG. 3 shows a pass gate circuit 100 according to a first embodiment. The pass gate circuit 100 can be cascaded to an internal input node of a circuit component consisting of low voltage transistors, as an input interface for clamping the amplitude of the signal provided to the internal input node and protecting the low voltage transistors from breaking down.

As shown in FIG. 3, the pass gate circuit 100 comprises: a first transistor 101 coupled between an input node 103 for receiving an input signal $V_{in}$ and an output node 105 for outputting an output signal $V_{out}$; and a second transistor 107 configured to generate a voltage difference between a second gate and a second source of the second transistor 107 in response to a bias current $I_{bias}$ flowing through the second transistor 107. The pass gate circuit 100 further comprises an amplifier 109 which is configured to compare the output signal $V_{out}$ with a reference voltage $V_{ref}$, and to supply the bias current $I_{bias}$ to the second transistor 107 according to the comparison of the output signal $V_{out}$ with the reference voltage $V_{ref}$. In the embodiment, the amplifier 109 is an operational transconductance amplifier (OTA). The first transistor 101 is a DMOS transistor. The DMOS transistor comprises a drift region coupled to the drain thereof, which allows the DMOS transistor to withstand the input signal $V_{in}$ of a significantly high voltage.

In the embodiment of FIG. 3, the first transistor 101 is an NMOS transistor, and the input signal $V_{in}$, to be delivered by the first transistor 101 is of a positive voltage. Therefore, the first gate of the first transistor 101 is elevated higher than the input signal $V_{in}$ by at least one threshold voltage $V_{th}$ of the first transistor 101, such that the first transistor 101 can be fully turned on during the delivery of the input signal $V_{in}$. The second transistor 107 is a PMOS transistor, and then the voltage of the second gate is lower than the voltage of the second source when the bias current $I_{bias}$ flows through the second transistor 107. The second source is coupled to an output of the amplifier 109 so as to receive the bias current $I_{bias}$, and the second drain is coupled to a first reference potential line 111, such as ground, to ensure the positive voltage difference between the second source and the second gate. The voltage difference may vary with the bias current $I_{bias}$ flowing through the second transistor 107. Moreover, the second gate is coupled to the output node 105. Therefore, the positive voltage difference can be applied between the first gate and the first source of the first transistor 101.

In some embodiments, the pass gate circuit 100 further comprises one or more transistors coupled in series with the second transistor 107, wherein each of the one or more transistors has a drain and a gate coupled together respectively. The bias current $I_{bias}$ can also flow through the one or more transistors, thereby further increasing the voltage difference applied between the first gate and the first source of the first transistor 101.

The amplifier 109 provides the bias current $I_{bias}$ according to the difference between the output signal $V_{out}$ and the reference voltage $V_{ref}$. In detail, the bigger the difference is, the bigger the bias current $I_{bias}$ is. In some embodiments, no bias current $I_{bias}$ is provided to the second transistor 107 when the output signal $V_{out}$ equals to the reference voltage $V_{ref}$. In such cases, the output signal $V_{out}$ cannot be higher than the reference voltage $V_{ref}$. The maximum amplitude of the output signal $V_{out}$ the first transistor 101 capable to deliver equals to the amplitude of the reference voltage $V_{ref}$. In other words, the amplitude of the output signal $V_{out}$ is clamped.

The reference voltage $V_{ref}$ could be a positive threshold voltage as required by an internal circuit 113, such as a Schmitt trigger. In operation, when the input signal $V_{in}$ is much lower than the reference voltage $V_{ref}$, the output signal $V_{out}$ is substantially equal to the input signal $V_{in}$. Accordingly, the bias current $I_{bias}$ supplied to the second transistor 107 is big enough to keep the second transistor 107 working under a saturation state. Furthermore, the voltage at the first gate of the first transistor 101 is elevated by the source-to-gate voltage of the second transistor 107 in comparison to the output signal $V_{out}$ and the input signal $V_{in}$. Therefore, the output signal $V_{out}$ may rise with the input signal $V_{in}$.

When the input signal $V_{in}$ rises and gradually approaches the reference voltage $V_{ref}$, the difference between the output voltage $V_{out}$ and the reference voltage $V_{ref}$ becomes smaller accordingly. Therefore, the bias current $I_{bias}$ supplied to the second transistor 107 gradually decreases, and the voltage difference applied between the first gate and the first source of the first transistor 101 decreases as well. When the bias current $I_{bias}$ equals to zero, the second transistor 107 is turned off. The output signal $V_{out}$ is clamped equal to the reference voltage $V_{ref}$, and the voltage at the first gate is fixed at the reference voltage $V_{ref}$ plus one threshold voltage $V_{th}$ of the first transistor 101. Under such condition, the first transistor 101 is still turned on, and there is no threshold voltage loss on the first transistor 101 during the delivery of the input signal $V_{in}$. In this way, the pass gate circuit 100 has a wider pass voltage range. Moreover, the amplifier 109 clamps the output signal $V_{out}$ not higher than the reference voltage $V_{ref}$, thereby protecting the internal circuit 113 from breaking down. Furthermore, the pass gate circuit 100 will not introduce any sensing error because there is no current path through the input node 103.

In the embodiment, the amplifier 109 comprises a differential input stage 115 and a first current mirror 117. The differential input stage 115 is configured to receive the output signal $V_{out}$ and the reference voltage $V_{ref}$, and to output a first current at a first output node 119 and a second current at a second output node 121 according to the output signal $V_{out}$ and the reference voltage $V_{ref}$. The first current mirror 117 is configured to mirror the second current to the first output node 119 to generate the bias current $I_{bias}$, according to the difference current between the first current and the second current.

Specifically, the differential input stage 115 comprises a third transistor 123, and a fourth transistor 125 coupled in parallel with the third transistor 123. A third source of the third transistor 123 and a fourth source of the fourth transistor 125 are coupled together to receive a reference current $I_{ref}$. The reference current $I_{ref}$ is provided by a current source. A third gate of the third transistor 123 is coupled to the output node 105 to receive the output signal $V_{out}$, and a fourth gate of the fourth transistor 125 is coupled to the reference voltage $V_{ref}$. A third drain of the third transistor 123 is coupled to a first branch 127 of the first current mirror 117, and a fourth drain of the fourth transistor 125 is coupled to a second branch 129 of the first current mirror 117. As the third source and the fourth source are coupled together, the first current outputted at the first output node 119 by the third transistor 123 is equal to the second current outputted at the second output node 121 by the fourth transistor 125 when the output signal $V_{out}$ to the reference voltage $V_{ref}$.

The first current mirror 117 comprises the first branch 127 and the second branch 129. The first branch 127 generates a mirror current according to a current flowing through the second branch 129, i.e., the first current flowing through the fourth transistor 125. In detail, the first branch 127 is coupled between a second reference potential line 133, such as a positive power supply, and the first output node 119. The second branch 129 is coupled between the second reference potential line 133 and the second output node 121. In the embodiment, the first branch 127 has a fifth transistor, and the second branch 129 has a six transistor which is pair coupled to the fifth transistor. The width-length ratio of the fifth transistor may be equal to that of the sixth transistor, to ensure the mirror current through the first branch 127 to be identical to the second current flowing through the second branch 129. In some other examples, the mirror current may be in proportion to the second current flowing through the second branch 129 at a ratio other than 1. Thus, the maximum amplitude of the output signal $V_{out}$ may be a bit different from the reference voltage $V_{ref}$, for example, lower or higher than the reference voltage $V_{ref}$.

Figure 4:
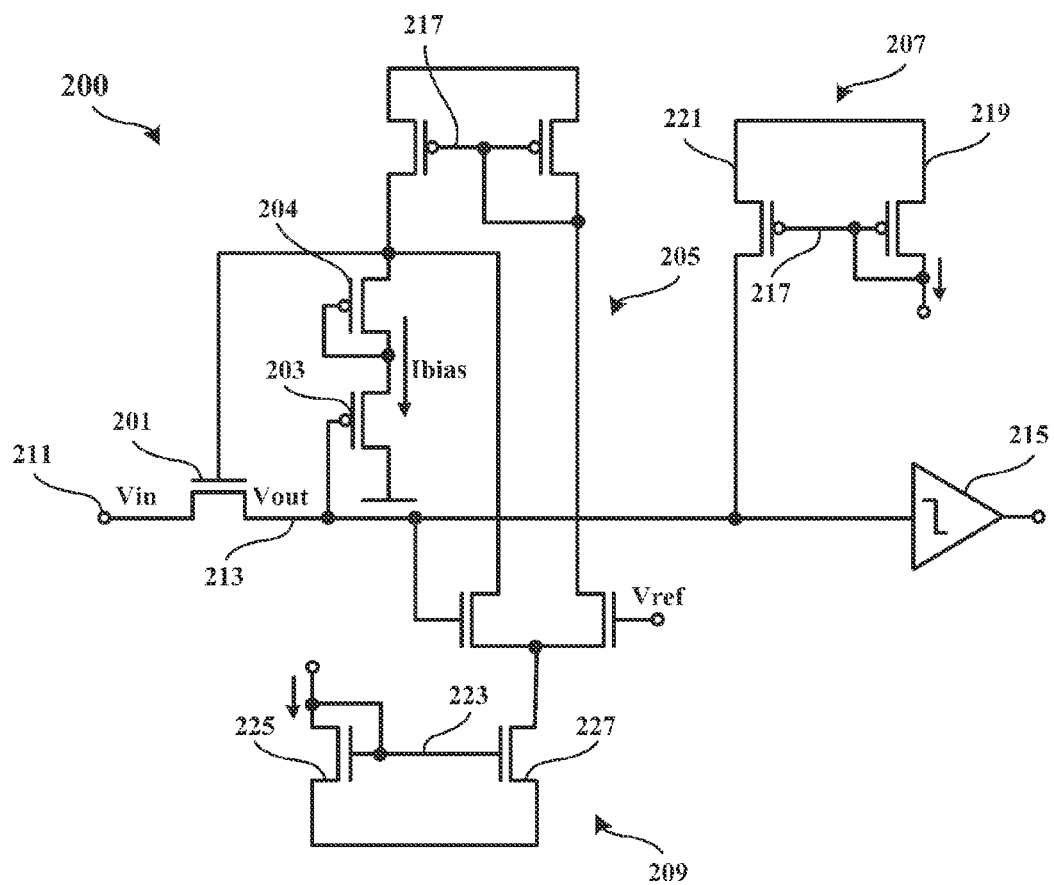
FIG. 4 shows a pass gate circuit according to a second embodiment.

FIG. 4 shows a pass gate circuit 200 according to a second embodiment.

As shown in FIG. 4, the pass gate 200 comprises a first transistor 201, a second transistor 203, a third transistor 204, an amplifier 205, a pull up circuit 207 and a current source 209.

The first transistor 201 is coupled between an input node 211 for receiving an input signal $V_{in}$ and an output node 213 for outputting an output signal $V_{out}$. The third transistor 204 is coupled in series with the second transistor 203. The second transistor 203 and the third transistor 204 are configured to generate a voltage difference between a second gate of the second transistor 203 and a third source of the third transistor 204 in response to a bias current $I_{bias}$ flowing therethrough, and to apply the voltage difference between a first gate of the first transistor 201 and the output node 213. The drain of the third transistor 204 is coupled to the amplifier 205 to receive the bias current $I_{bias}$ therefrom, and the source of the third transistor 204 is coupled to the first gate of the first transistor 201. In this way, the bias current $I_{bias}$ can flow through both of the second transistor 203 and the third transistor 204, thereby further increasing the voltage difference applied to the first gate and the first source of the first transistor 201. With the additional gate-to-source voltage of the third transistor 204, the voltage difference between the first source and the first gate can be significantly improved to ensure the first transistor 201 to be turned on, even if the gate-to-source voltage of the second transistor 203 is not bigger than the threshold voltage of the first transistor 201 in some cases.

The amplifier 205 is configured to compare the output signal with a reference voltage $V_{ref}$, and to supply the bias current $I_{bias}$ to the second transistor 203 according to the comparison of the output signal $V_{out}$ and the reference voltage $V_{ref}$.

The pull up circuit 207 is configured to provide a pull up current to the output node 213, which is coupled to an internal input node of an internal circuit 215. The pull up circuit 207 can set the voltage of the output node 213 to a fixed voltage level when the input node 211 is floating, thereby preventing the internal circuit 215 from working under an uncertain state. In the embodiment, the pull up circuit 207 comprises a second current mirror 217 having a third branch 219 and a fourth branch 221. The third branch 219 is configured to receive a reference current, and the fourth branch 221 is coupled to the output node 213 to provide the pull up current in response to the reference current. Therefore, when the input node 211 is floating, the pull up current can pull up the voltage at the output node 213 to a high voltage, for example, to a positive power supply.

The current source 209 is coupled to the amplifier 205, and configured to provide a reference current to supply the amplifier 205. In the embodiment, the current source 209 comprises a third current mirror 223 having a fifth branch 225 and a sixth branch 227 which mirrors the current flowing through the fifth branch 225.

In the embodiment, the voltage at the first gate of the first transistor 201 can be elevated with the output signal $V_{out}$ via the second and third transistors 203 and 204, and thus the output signal $V_{out}$ outputted by the first transistor 201 will not experience a threshold voltage loss in comparison with the input signal $V_{in}$. In this way, the pass gate circuit 200 has a wider pass voltage range. Besides, the amplifier 205 can be used to clamp the output signal $V_{out}$ lower than the reference voltage.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A pass gate circuit, comprising:
   a first transistor coupled between an input node configured to receive an input signal and an output node configured to output an output signal;
   a second transistor configured to generate a voltage difference for application between a first gate of the first transistor and the output node in response to a bias current flowing through said second transistor; and
   an amplifier configured to compare the output signal with a reference voltage and supply the bias current to the second transistor in response to said comparison.

2. The circuit as claimed in claim 1, wherein the amplifier comprises:
a differential input stage configured to receive the output signal and the reference voltage and output a first current at a first output node and a second current at a second output node according to a difference between the output signal and the reference voltage; and
a first current mirror, configured to mirror the second current to the first output node to generate the bias current according to said difference.

3. The circuit as claimed in claim 2, wherein the differential input stage comprises:
a third transistor and a fourth transistor differentially coupled with the third transistor,
wherein a third source of the third transistor and a fourth source of the fourth transistor are coupled together to receive a reference current, a third gate of the third transistor is coupled to the output node to receive the output signal, a fourth gate of the fourth transistor is coupled to the reference voltage, a third drain of the third transistor is coupled to a first branch of the first current mirror, and a fourth drain of the fourth transistor is coupled to a second branch of the first current mirror.

4. The circuit as claimed in claim 2, wherein the first current mirror has a first branch and a second branch, the first branch being coupled between a reference potential line and the first output node, and the second branch being coupled between the reference potential line and the second output node.

5. The circuit as claimed in claim 1, further comprising a current source coupled to the amplifier and configured to provide a reference current to supply the amplifier.

6. The circuit as claimed in claim 1, wherein the first transistor is an NMOS transistor, and the second transistor is a PMOS transistor, a second source of the second transistor is coupled to the amplifier, a second gate of the second transistor is coupled to the output node, and a second drain of the second transistor is coupled to a first reference potential line.

7. The circuit as claimed in claim 1, further comprising one or more transistors coupled in series with the second transistor, wherein each of the one or more transistors has a drain and a gate coupled together respectively.

8. The circuit as claimed in claim 1, wherein the first transistor is a DMOS transistor.

9. The circuit as claimed in claim 1, further comprising a pull up circuit, configured to provide a pull up current to the output node.

10. The circuit as claimed in claim 9, wherein the pull up circuit comprises a second current mirror having a third branch and a fourth branch, the third branch being configured to receive a reference current, and the fourth branch being coupled to the output node to provide the pull up current in response to the reference current.

11. The circuit as claimed in claim 1, further comprising a Schmitt trigger circuit having an input coupled to the output node of the first transistor.

12. A circuit, comprising:
a first transistor having a source-drain path coupled between an input node and an output node, said first transistor having a first gate;
a second transistor having a source-drain path coupled between a biasing node and a reference supply node, said second transistor having a second gate coupled to the output node;
wherein said first gate is coupled to the biasing node; and
a differential amplifier configured to compare a voltage at the output node to a reference voltage and generate a biasing current at said biasing node which is proportional to a difference between the voltage at the output node and the reference voltage.

13. The circuit of claim 12, further comprising a diode connected transistor coupled in series with the second transistor between the biasing node and the reference supply node.

14. The circuit of claim 12, wherein the reference supply node is ground.

15. The circuit of claim 12, further comprising a pull-up circuit coupled to the output node and configured to pull up a voltage at the output node to a reference supply voltage in response to a floating condition at the input node.

16. A method, comprising:
passing an input signal from an input node to an output node through a first transistor;
sensing a difference between a voltage at the output node and a reference voltage;
generating a biasing current in response to said sensed difference;
using the biasing current to generate a voltage difference; and
applying said voltage difference between a control terminal of the first transistor and said output node;
wherein the step of using the biasing current comprises passing said biasing current through a source-drain path of a second transistor and applying the voltage at the output node to a control terminal of said second transistor.

17. The method of claim 16, wherein the step of using the biasing current further comprises passing said biasing current through a source-drain path of a third transistor coupled in series with the first transistor.

18. The method of claim 17, further comprising operating said third transistor as a diode.

19. The method of claim 16, further comprising pulling-up said output node to a reference supply voltage in response to a floating condition at the input node.

* * * * *